(12) United States Patent
Morita

(10) Patent No.: US 11,551,922 B2
(45) Date of Patent: Jan. 10, 2023

(54) METHOD OF POLISHING SILICON WAFER INCLUDING NOTCH POLISHING PROCESS AND METHOD OF PRODUCING SILICON WAFER

(71) Applicant: SUMCO CORPORATION, Tokyo (JP)

(72) Inventor: Tsuyoshi Morita, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 863 days.

(21) Appl. No.: 16/467,273

(22) PCT Filed: Sep. 22, 2017

(86) PCT No.: PCT/JP2017/034346
§ 371 (c)(1),
(2) Date: Jun. 6, 2019

(87) PCT Pub. No.: WO2018/116558
PCT Pub. Date: Jun. 28, 2018

(65) Prior Publication Data
US 2019/0348270 A1    Nov. 14, 2019

(30) Foreign Application Priority Data

Dec. 20, 2016   (JP) .............................. JP2016-246938

(51) Int. Cl.
*H01L 21/02*       (2006.01)
*B24B 9/06*        (2006.01)
(Continued)

(52) U.S. Cl.
CPC ........ *H01L 21/02013* (2013.01); *B24B 9/065* (2013.01); *B24B 37/08* (2013.01);
(Continued)

(58) Field of Classification Search
CPC ......... H01L 21/02013; H01L 21/67288; H01L 21/02021; H01L 21/02024; H01L 21/304;
(Continued)

(56) References Cited

U.S. PATENT DOCUMENTS

2005/0221615 A1* 10/2005 Toyota .............. H01L 21/30625
438/692
2009/0017733 A1*  1/2009 Takahashi ......... H01L 21/67161
451/65

(Continued)

FOREIGN PATENT DOCUMENTS

JP    2002-299290 A    10/2002
JP    2005-277050 A    10/2005
(Continued)

OTHER PUBLICATIONS

International Search Report issued in International Patent Application No. PCT/JP2017/034346, dated Nov. 28, 2017.
(Continued)

*Primary Examiner* — John P. Dulka
(74) *Attorney, Agent, or Firm* — Greenblum & Bernstein, P.L.C.

(57) ABSTRACT

Provided are a method of polishing a silicon wafer and a method of producing a silicon wafer which can reduce the formation of step-forming microdefects on a silicon wafer. The method includes: a double-side polishing step of performing polishing on front and back surfaces of a silicon wafer; a notch portion polishing step of performing polishing on a beveled portion of a notch portion of the silicon wafer after the double-side polishing step; a peripheral beveled portion polishing step of performing polishing on the beveled portion on the periphery of the silicon wafer other than the beveled portion of the notch portion after the notch portion polishing step; and a finish polishing step of performing finish polishing on the front surface of the
(Continued)

silicon wafer after the peripheral beveled portion polishing step. The notch portion polishing step is performed in a state where the front surface is wet with water.

18 Claims, 5 Drawing Sheets

(51) Int. Cl.
- *B24B 37/08* (2012.01)
- *C30B 15/00* (2006.01)
- *C30B 29/06* (2006.01)
- *H01L 21/67* (2006.01)

(52) U.S. Cl.
CPC ............... *C30B 15/00* (2013.01); *C30B 29/06* (2013.01); *H01L 21/67288* (2013.01)

(58) Field of Classification Search
CPC ......... H01L 21/02016; H01L 21/02052; H01L 21/02057; B24B 9/065; B24B 37/08; B24B 1/00; B24B 9/00; C30B 15/00; C30B 29/06; C30B 33/00
See application file for complete search history.

(56) References Cited

U.S. PATENT DOCUMENTS

| | | | |
|---|---|---|---|
| 2009/0117828 A1 | 5/2009 | Hongo et al. | |
| 2010/0022166 A1* | 1/2010 | Kimba | B24B 9/065 |
| | | | 451/6 |
| 2010/0136886 A1 | 6/2010 | Hongo et al. | |
| 2014/0287656 A1* | 9/2014 | Schwandner | B24B 37/042 |
| | | | 451/41 |

FOREIGN PATENT DOCUMENTS

| | | | |
|---|---|---|---|
| JP | 2007-524231 A | | 8/2007 |
| JP | 2010-40950 A | | 2/2010 |
| JP | 2010-137328 A | | 6/2010 |
| JP | 2010137328 A | * | 6/2010 |
| JP | 2014-180753 A | | 9/2014 |

OTHER PUBLICATIONS

International Preliminary Report on Patentability (IPRP) for PCT/JP2017/034346 dated Jul. 4, 2019.
Office Action for DE App. No. 11 2017 006 401.5, dated May 19, 2022 (w/ translation).
Office Action for CN App. No. 201780079260.4, dated Sep. 13, 2022 (w/ translation).

\* cited by examiner

RELATED ART

METHOD OF POLISHING SILICON WAFER INCLUDING NOTCH POLISHING PROCESS AND METHOD OF PRODUCING SILICON WAFER

TECHNICAL FIELD

This disclosure relates to a method of polishing a silicon wafer and a method of producing a silicon wafer

BACKGROUND

Conventionally, silicon wafers are widely used as substrates for semiconductor devices. A silicon wafer is produced in the following manner. First, a single crystal silicon ingot is grown by the Czochralski (CZ) process or the like. Next, the periphery of the grown single crystal silicon ingot is subjected to grinding to adjust the diameter of the ingot to a predetermined value.

Next, a notch portion indicating a certain crystal direction is formed on the peripheral surface of the single crystal silicon ingot having been subjected to grinding of the periphery. For example, a notch portion indicating the <110> direction for example is formed in a silicon wafer in which the crystal plane is the (100) plane. This notch portion is formed as a groove with an arc shape or an approximate V shape for example by moving a grindstone in the axial direction of the ingot, with the grindstone being in contact with the periphery of the ingot.

Subsequently, the single crystal silicon ingot provided with the notch portion is cut into blocks, a resultant single crystal silicon block is sliced using for example a wire saw apparatus, and a resultant silicon wafer is subjected to beveling, primary planarization (lapping), polishing, etc.

The beveling adjusts the shape of a peripheral end portion of the silicon wafer to a predetermined shape using a beveling apparatus. This beveling is also performed on the notch portion.

In the primary planarization, the front surface of the silicon wafer (on which a device is fabricated) and the back surface thereof are subjected to rough grinding using a lapping apparatus, a double-disc grinding apparatus, etc., thereby increasing the parallelism of the front and back surfaces of the wafer.

In the polishing, the front and back surfaces of the silicon wafer are polished to increase the flatness of the wafer. The polishing roughly falls into two methods: double-side polishing for simultaneously polishing front and back surfaces of a silicon wafer and single-side polishing for polishing the front surface only.

In double-side polishing, the front and back surfaces of a silicon wafer loaded into a retainer opening of a carrier plate are simultaneously polished to a desired thickness at a relatively high polishing rate using a relatively hard polishing cloth for example made of polyurethane. By contrast, in single-side polishing, the front surface of a silicon wafer is polished using a relatively soft polishing cloth like suede and fine abrasive grains, thereby reducing micro surface roughness on the silicon wafer surface, such as nanotopography or haze. The single-side polishing performed at the end is called finish polishing.

In the above polishing, chemical mechanical polishing (CMP) is typically used, in which while a slurry obtained by adding abrasive grains of for example silica to an alkaline aqueous solution is supplied as a polishing agent, the silicon wafer and the polishing cloth are relatively rotated. The CMP process is a method using the mechanical polishing action of abrasive grains and the chemical polishing action of the alkaline aqueous solution in combination, and the combined action allows the silicon wafer surface to be mirror-finished, thereby achieving high flatness.

Further, in the above polishing, it is necessary to prevent emission of particles not only from the front and back surfaces of the silicon wafer but also from the beveled portion. Accordingly, polishing is performed also on the beveled portion on the periphery of the wafer to mirror-finish the beveled portion, and polishing is also performed in the like manner on the beveled portion of the notch portion.

Here, when polishing is performed on the beveled portion of the wafer periphery before performing double-side polishing, the inner circumferential surface of the wafer retainer opening of the carrier plate and the mirror-finished beveled surface are in contact with one another in the double-side polishing, which would cause scratches to damage the beveled surface. To address this, performing polishing on a beveled surface after double-side polishing has been reported (see JP 2002-299290 A (PTL 1) for example).

In recent years, as silicon wafers are increasingly miniaturized and integrated, the silicon wafers are required to have a very flat surface. For the evaluation of the flatness of a surface of such silicon wafers, differential interference contrast (DIC) microscopy has been used. The DIC microscopy is a technique by which the number of step-forming microdefects having a raised or recessed shape with a height (or depth) exceeding a predetermined threshold value (for example, 2 nm) in a surface of a wafer can be determined. Note that the step-forming microdefects are defects with a width of 30 μm to 200 μm and a height of around 2 nm to 90 nm, which are hardly detected in other detection modes.

FIG. 1 is a diagram illustrating the principle of detecting step-forming microdefects by DIC microscopy. As illustrated in this diagram, laser L (for example He—Ne laser) is split by a beam splitter B, and a surface of a silicon wafer W is irradiated with the split laser. A photodiode P receives reflection light reflected from the surface of the silicon wafer W via a mirror M. When the surface of the silicon wafer W has a step-forming microdefect D having a raised or recessed shape, a phase contrast typical of step-forming microdefects is found. The height information of the defect can be calculated from the optical path difference of the reflection light. In this specification, a step-forming microdefect having a raised or recessed shape with a height of 2 nm or more, which is detected by DIC microscopy is hereinafter simply referred to as "step-forming microdefect".

If the number of step-forming microdefects is within a required range, the quality of the silicon wafer surface can be determined as good. On the other hand, silicon wafers that do not meet the required range are determined as nonconforming items, and so cannot be shipped as products.

CITATION LIST

Patent Literature

PTL 1: JP 2002-299290 A

SUMMARY

Technical Problem

However, in cases where the beveled portion is subjected to polishing after performing double-side polishing, followed by finish polishing on a surface of a silicon wafer, step-forming microdefects formed on the finish-polished silicon wafer surface are found to be increased.

It could therefore be helpful to provide a method of polishing a silicon wafer and a method of producing a silicon wafer which can reduce the formation of step-forming microdefects on a silicon wafer.

Solution to Problem

With a view to solving the above problem, we investigated the entire wafer production process to study the cause of the formation of step-forming microdefects. As a result, we found that when a beveled portion of a notch portion formed on the periphery of a silicon wafer is subjected to polishing, after a slurry is splashed on the front surface of the wafer, the splash of the slurry dries to cause abrasive grains (for example, silica) contained in the splash to adhere to the surface, thus when finish polishing is performed in the presence of the deposit, step-forming microdefects are formed.

In view of the above, we diligently studied ways to prevent abrasive grains contained in the slurry splash on the silicon wafer from adhering to the front surface of the silicon wafer when polishing is performed on the beveled portion of the notch portion. In the above study, it was found that performing polishing on the beveled portion of the notch portion in a state where the front surface of the silicon wafer is wet with water is significantly effective. This discovery led to this disclosure.

Specifically, we propose the following features.

(1) A method of polishing a silicon wafer, comprising:
a double-side polishing step of performing polishing on a front surface and a back surface of a silicon wafer;
a notch portion polishing step of performing polishing on a beveled portion of a notch portion of the silicon wafer after the double-side polishing step;
a peripheral beveled portion polishing step of performing polishing on the beveled portion on a periphery of the silicon wafer other than the beveled portion of the notch portion after the notch portion polishing step; and
a finish polishing step of performing finish polishing on the front surface of the silicon wafer after the peripheral beveled portion polishing step,
wherein the notch portion polishing step is performed in a state where the front surface is wet with water.

(2) The method of polishing a silicon wafer, according to (1) above, wherein the water wet state is achieved by subjecting the front surface to a hydrophilization process to obtain a hydrophilic surface and supplying water to the hydrophilic surface after the double-side polishing step.

(3) The method of polishing a silicon wafer, according to (2) above, wherein the hydrophilization process is chemical cleaning.

(4) The method of polishing a silicon wafer, according to (2) or (3) above, wherein the supply of water is performed at a flow rate of 1 L/min or more and 10 L/min or less.

(5) The method of polishing a silicon wafer, according to (1) above, wherein the water wet state is achieved by continuously supplying water to the front surface after the double-side polishing step.

(6) The method of polishing a silicon wafer, according to any one of (1) to (5) above, wherein chemical cleaning is not performed between the peripheral beveled portion polishing step and the finish polishing step.

(7) A method of producing a silicon wafer, comprising the steps in the following order of: forming a notch portion on a periphery of a single crystal silicon ingot grown by the Czochralski process; slicing the ingot to obtain a silicon wafer; and subjecting the sliced silicon wafer to the method of polishing a silicon wafer, according to any one of (1) to (6) above.

Advantageous Effect

According to this disclosure, polishing on a beveled portion of a notch portion of a silicon wafer is performed in a state where the front surface of the silicon wafer is wet with water, thus abrasive grains contained in splash of a slurry are prevented from adhering to the surface and the formation of step-forming microdefects can be reduced.

DETAILED DESCRIPTION (Method of Polishing Silicon Wafer)

Embodiments of this disclosure are described below with reference to the drawings. A method of polishing a silicon wafer according to this disclosure includes: a double-side polishing step of performing polishing on a front surface and a back surface of a silicon wafer; a notch portion polishing step of performing polishing on a beveled portion of a notch portion of the silicon wafer after the double-side polishing step; a peripheral beveled portion polishing step of performing polishing on the beveled portion on the periphery of the silicon wafer (peripheral beveled portion) other than the beveled portion of the notch portion after the notch portion polishing step; and a finish polishing step of performing finish polishing on the front surface of the silicon wafer after the peripheral beveled portion polishing step. Here, the notch portion polishing step is performed in a state where the front surface is wet with water.

As described above, the silicon wafer provided with the beveled portion is subjected to double-side polishing, polishing of the beveled portion, and finish polishing, in this order. FIGS. 2A to 2D are diagrams illustrating a polishing process performed on a beveled portion on the periphery of a silicon wafer. As illustrated in the diagrams, polishing of the beveled portion includes the following four steps.

Figure 1:
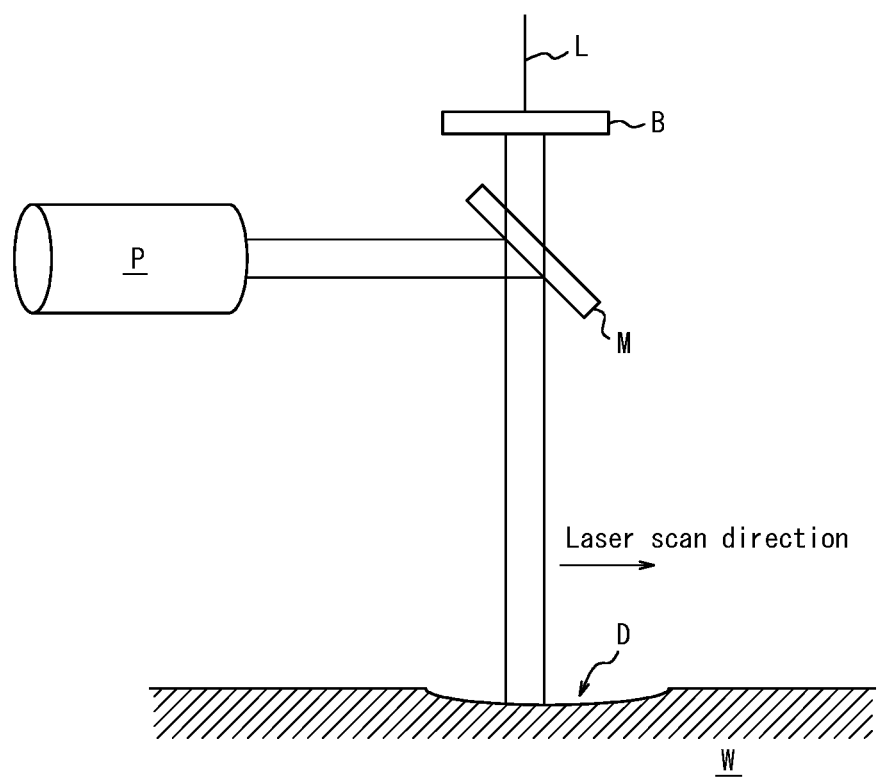
FIG. 1 is a diagram illustrating the principle of measuring step-forming microdefects by differential interference contrast microscopy.
Figure 2A:
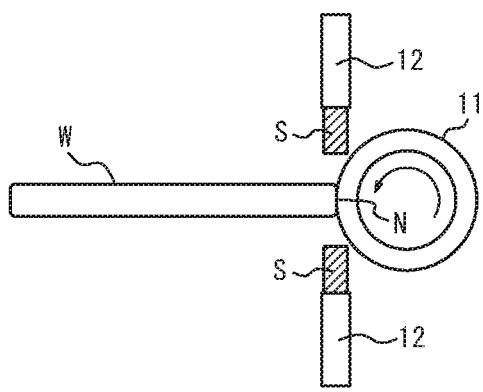
FIGS. 2A to 2D are diagrams illustrating a polishing process performed on a beveled portion on the periphery of a silicon wafer.

First, the notch portion polishing step of performing polishing on the beveled portion of the notch portion is performed. Specifically, as illustrated in FIG. 2A, a polishing pad 11 with a small diameter is rotated. A slurry S is then supplied to a beveled portion of a notch portion N of a silicon wafer W from a slurry supply means 12, and the notch portion N is pressed against the polishing pad 11 while changing the angle of the silicon wafer W. Thus, the beveled portion of the notch portion N is mirror-finished.

Figure 2B:
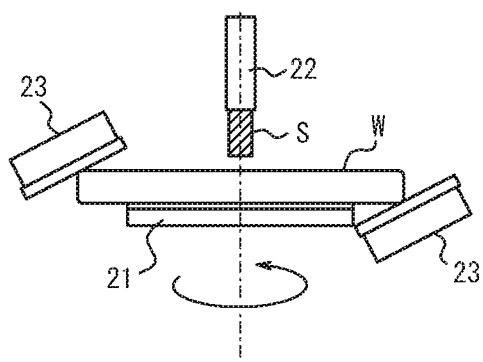

Next, the peripheral beveled portion polishing step is performed in which the beveled portion on the periphery of the wafer other than the beveled portion of the notch portion N is subjected to polishing. Specifically, as illustrated in FIG. 2B, a table 21 on which the silicon wafer W is placed is rotated. Polishing pads 23 are then pressed against the peripheral beveled portion of the silicon wafer W while supplying the slurry S from a slurry supply means 22 to a center portion of the silicon wafer W. Thus, the beveled portion on the periphery of the wafer other than the beveled portion of the notch portion N is mirror-finished.

Figure 2C:
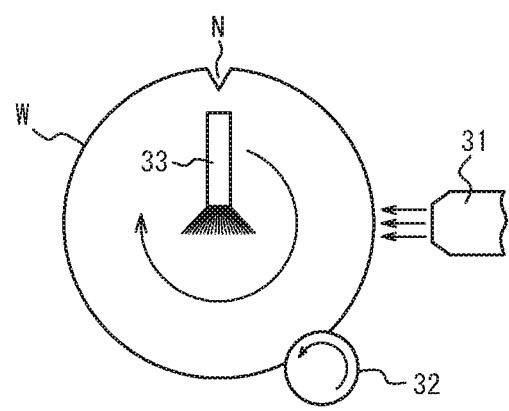

Subsequently, a cleaning step is performed, in which the silicon wafer W having been subjected to polishing of the beveled portion as described above is subjected to a cleaning step of cleaning the wafer. Specifically, as illustrated in FIG. 2C, a table (not shown) on which the silicon wafer W is placed is rotated. Subsequently, while air and pure water are sprayed on the periphery of the silicon wafer W from a two-fluid nozzle 31 placed outside the wafer in the wafer plane direction, a brush 32 is pressed against the periphery of the silicon wafer W while being rotated, with pure water being supplied from a water supply means 33 to the front surface of the silicon wafer W. Thus, the front surface and the entire periphery of the silicon wafer W are cleaned.

Figure 2D:
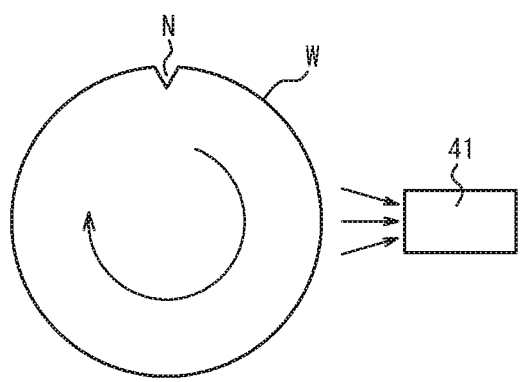

Finally, a drying step of drying the silicon wafer W having been cleaned is performed. As illustrated in FIG. 2D, this step can be performed, for example, by spin drying. A table (not shown) on which the silicon wafer W is placed is rotated at high speed to dry the surface of the silicon wafer W by blowing off water deposited on the surface, and the blown water is collected by a suction means 41.

Figure 3A:
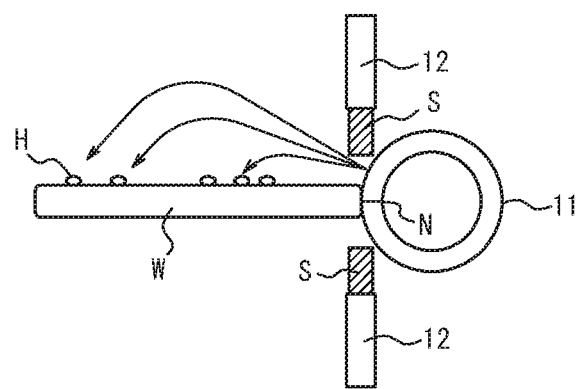
FIGS. 3A and 3B are diagrams illustrating the principle of preventing a slurry splashed on the front surface of a silicon wafer from adhering to the surface, according to this disclosure.

In the process of investigating the cause of the formation of step-forming microdefects, we found that in polishing the beveled portion of the notch portion N depicted in FIG. 3A, abrasive grains contained in the splash H adhere to the surface of the silicon wafer W. In polishing the beveled portion of the notch portion N, the silicon wafer W is not rotated. Further, the slurry S is only supplied locally to the notch portion N. Accordingly, part of the front surface other than a part around the notch portion N is dry during the polishing on the beveled portion of the notch portion. When the slurry S is splashed to be deposited on the front surface of this dry silicon wafer W, the splash H of the slurry S deposited dries, and abrasive grains contained in the splash H conceivably adheres to the surface.

When polishing is performed on the peripheral beveled portion other than the beveled portion of the notch portion N, illustrated in FIG. 2B, the slurry S is supplied to a center portion of the rotating silicon wafer W, thus the slurry S is supplied to the entire front surface, and the front surface of the silicon wafer W is wet. Accordingly, the abrasive grains contained in the slurry S would not adhere to part of the surface during polishing of the beveled portion.

We found that when a silicon wafer W in which abrasive grains as described above adhere to the front surface is subjected to the next step that is the finish polishing step, the rate of polishing on part of the surface to which the abrasive grains adhere is lower than that on the other part, which results in the formation of step-forming microdefect.

We thus found that in polishing on the beveled portion of the notch portion N, the splash H of the slurry S splashed on the front surface of the silicon wafer W dries, and the abrasive grains contained in the splash H adhere to part of the surface, which contributes to the formation of step-forming microdefects.

To address this, we diligently studied ways to prevent the abrasive grains contained in the splash H of the slurry S from adhering to the front surface when polishing is performed on the beveled portion of the notch portion N. As a result, we contemplated performing the polishing in a state where the front surface of the silicon wafer is wet with water.

Figure 3B:
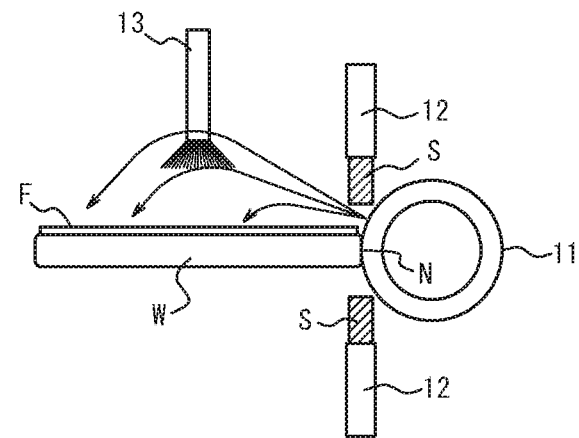

Here, "state where the front surface of the silicon wafer is wet with water" refers to a state where a water layer F is formed on the front surface of the silicon wafer W as illustrated in FIG. 3B. This water layer F can prevent the splash H from drying on the front surface of the silicon wafer W even when the slurry S is splashed on the front surface of the wafer, which can inhibit the adhesion of the abrasive grains contained in the splash H to the surface.

In a specific example, the above water layer F may be formed by subjecting the front surface of the silicon wafer W to a hydrophilization process to obtain a hydrophilic surface, and then supplying water to the hydrophilic surface. Incidentally, the front surface of the silicon wafer W is hydrophobic after being subjected to double-side polishing that is a step preceding the polishing. Such a hydrophobic front surface repels water even when water is supplied thereto, thus the water layer F is hardly formed. In view of the above, first, the front surface which is hydrophobic after double-side polishing is subjected to a hydrophilization process to obtain a hydrophilic surface.

The above hydrophilization process can be performed for example by chemical cleaning. Specifically, the front surface of the silicon wafer W is subjected to for example SC-1 using ozone water to oxidize the front surface of the silicon wafer W, thereby forming a silicon oxide film. The silicon oxide film is hydrophilic, thus the front surface which is hydrophobic immediately after double-side polishing can be made to be a hydrophilic surface.

Water is supplied to the resultant hydrophilic surface, thus the water layer F can be formed on the front surface of the silicon wafer W. The above supply of water can be performed using a water supply means such as a shower. Further, the water to be supplied is pure water or ultrapure water which has higher purity than pure water.

Further, the above supply of water is preferably performed at a flow rate of 1 L/min or more and 10 L/min or less. When the flow rate is set to be 1 L/min or more, a good water layer F can be formed on the entire front surface of the silicon wafer W. Moreover, a higher water supply flow rate is effective for the formation of the water layer F; however, the water supply flow rate is not required to be excessively high, and in terms of reducing the production cost, the flow rate is preferably 10 L/min or less.

Alternatively, the water layer F may be formed by immersing, into water, the silicon wafer W having been subjected to the hydrophilization process.

This disclosure can prevent deposits from being attached to the front surface of the silicon wafer when performing polishing on the beveled portion of the notch portion N. This renders it unnecessary to remove deposits attached to the front surface of the silicon wafer by performing chemical cleaning between the peripheral beveled portion polishing step and the start of the finish polishing step, which steps have conventionally been performed. Thus, the cost of for example agents used for chemical cleaning can be cut.

Note that drying and adhesion of the splash H of the slurry S splashed on the front surface can also be inhibited by continuously supplying water to the front surface of the silicon wafer W during the above polishing on the beveled portion of the notch portion instead of performing the above formation of the water layer F. Accordingly, the state obtained by this feature is also included in the "state where the front surface of the silicon wafer is wet with water"

specified herein. In this case, the front surface of the silicon wafer S may remain hydrophobic, or may be a hydrophilic surface obtained by performing the hydrophilization process.

The above supply of water is not necessarily performed continuously and may be performed intermittently as long as the splash H of the slurry S splashed and attached to the front surface of the silicon wafer W does not dry.

Thus, the formation of step-forming microdefects on the front surface of the silicon wafer can be reduced.

(Method of Producing Silicon Wafer)

A method of producing a silicon wafer will now be described. In a method of producing a silicon wafer according to this disclosure, a silicon ingot is grown by the Czochralski process, the grown ingot is sliced to obtain a silicon wafer, and subjecting a beveled portion of a notch portion of the resultant silicon wafer to polishing under predetermined conditions by the above disclosed method of polishing a silicon wafer. Accordingly, this method is not limited in any way except that the double-side polishing step, the notch portion polishing step, and the peripheral beveled portion polishing step, and the finish polishing step are performed in this order, and that the notch portion polishing step is performed in a state where the front surface of the silicon wafer is wet with water. An example of the disclosed method of producing a silicon wafer is described below.

First, polycrystalline silicon loaded into a quartz crucible is melted at approximately 1400° C., and a seed crystal is then dipped into the silicon melt, followed by pulling the seed crystal up while rotating the seed crystal, thus a single crystal silicon ingot in which the crystal plane is for example the (100) plane is produced. Here, the silicon ingot is doped with for example, boron or phosphorus in order to obtain the desired resistivity. Further, the oxygen concentration of the silicon ingot can be controlled by the magnetic field applied Czochralski process (MCZ process) in which a magnetic field is applied when forming the ingot.

Next, grinding is performed on the periphery of the resultant single crystal silicon ingot to make its diameter uniform, a grindstone having an appropriate shape is then pressed against the peripheral surface of the ingot, and the grindstone is moved in the axial direction of the ingot repeatedly, thus a notch portion indicating for example the <110> direction is formed. After that, the ingot provided with the notch portion is machined by being cut into blocks.

Subsequently, the single crystal silicon block in which the notch portion is formed is sliced into silicon wafers using a wire saw or an ID blade slicer.

Next, a peripheral end of the silicon wafer is subjected to a primary beveling procedure (rough beveling). This can be performed by grinding using a fine grinding grindstone in which a grove having a shape corresponding to the bevel shape is previously formed by truing; contouring; etc. For example, a cylindrical grindstone such as a coarse grit diamond wheel is pressed against the periphery of the silicon wafer while being rotated, thus the primary beveling procedure is performed. In this manner, the periphery of the silicon wafer is worked into a predetermined rounded shape.

After that, the main surfaces of the silicon wafer are subjected to a primary planarization procedure. In the primary planarization procedure, the silicon wafer is placed between a pair of lapping plates parallel to each other, and while lapping liquid which is for example a mixture of abrasive grains of alumina or the like, a dispersant, and water is supplied between the lapping plates, the plates are rotated and slid under a predetermined pressure. Thus, the front and back surfaces of the silicon wafer are mechanically lapped, thereby increasing the parallelism of the wafer surfaces. For the primary planarization procedure, the front and back surfaces of the wafer may be ground using a double-disc grinding apparatus, or may be subjected to both lapping and double-disc grinding.

Next, the notch portion of the silicon wafer having been subjected to the primary planarization procedure is subjected to beveling. Specifically, for example, a metal-bonded or resin-bonded grindstone is pressed against the notch portion of the silicon wafer while being rotated, and the grindstone is moved along the contour of the notch portion, thereby performing beveling on the notch portion of the silicon wafer. The beveled notch portion may be further subjected to known tape beveling.

After that, the periphery of the silicon wafer having been subjected to the primary planarization procedure is subjected to a secondary beveling procedure. Specifically, for example, a metal-bonded or resin-bonded grindstone of a finer grit than the grindstone used in the primary beveling procedure is pressed against the periphery of the silicon wafer while being rotated, thereby performing the secondary beveling procedure (finish beveling) on the silicon wafer. The beveled periphery may be further subjected to known tape beveling.

Next, the silicon wafer having been subjected to the secondary beveling procedure is subjected to etching. Specifically, warpage of the wafer caused by the procedures in the previous steps is eliminated by acid etching using an aqueous solution containing of at least one of hydrofluoric acid, nitric acid, acetic acid, and phosphoric acid; alkali etching using a potassium hydroxide aqueous solution, a sodium hydroxide aqueous solution, etc.; or a combination of the above acid etching and alkali etching.

Note that the silicon wafer having been subjected to etching may be subjected to surface grinding to further increase the flatness of the wafer. This surface grinding may use a single-disc surface grinding apparatus or a double-disc surface grinding apparatus.

After that, the front surface and the back surface of the silicon wafer are subjected to double-side polishing using a double-side polishing apparatus. The double-side polishing is performed by fitting the silicon wafer into an opening of a carrier plate; then holding the carrier plate between an upper plate and a lower plate to each of which a polishing cloth is attached; flowing a slurry, in which for example abrasive grains of colloidal silica or the like are contained in an alkali solution, into the space between the upper and lower and plates and the wafer; and rotating the upper and lower plates and the carrier plate in opposite directions. Thus, irregularities on the surfaces of the wafer can be reduced, so that a high flatness wafer can be obtained.

Subsequently, the beveled portion on the periphery of the silicon wafer is subjected to polishing. First, the beveled portion of the notch portion is subjected to polishing. This polishing is performed by pressing a urethane buff shaped like a disk with an end having a tapered shape against the beveled portion of the notch portion while rotating the buff. Note that the polishing on the beveled portion of the notch portion may be polishing by pressing rotating polishing tape against the notch portion.

In this disclosure, it is important to perform the polishing on the beveled portion of the notch portion in a state where the front surface of the silicon wafer is wet with water. Thus, when the beveled portion of the notch portion is subjected to polishing, the splash H of the slurry S splashed on the front surface of the silicon wafer can be prevent from drying and the abrasive grains contained in the splash H can be precluded from adhering to the surface. Consequently, the formation of step-forming microdefects in the silicon wafer during finish polishing can be reduced.

In a similar manner, polishing is performed on the beveled portion on the periphery other than the beveled portion of the notch portion. For example, the silicon wafer is rotated with the back surface of the wafer being held by a suction stage, and a polishing buff made of for example urethane is pressed against the peripheral end portion of the rotating wafer, thereby mirror-finishing the beveled portion on the periphery of the silicon wafer.

After that, the front surface of the silicon wafer having been subjected to polishing on the beveled portion is subjected to finish polishing using a single-side polishing apparatus. The finish polishing can be performed using a polishing cloth made of a suede material and using for example an alkaline polishing agent containing colloidal silica as a polishing agent.

Next, the silicon wafer having been subjected to finish polishing is transferred to undergo a cleaning step in which particles, organic matter, metal, etc. on the wafer surface are removed using for example a SC-1 cleaning solution that is a mixture of aqueous ammonia, a hydrogen peroxide solution, and water, or a SC-2 cleaning solution that is a mixture of hydrochloric acid, a hydrogen peroxide solution, and water.

Finally, the cleaned silicon wafer is transferred to undergo an examination step, and the flatness of the wafer, the number of Light Point Defects (LPDs) on the wafer surface, damage, contamination of the wafer surface, etc. are examined. Only wafers which have passed those examinations and satisfy specified product quality requirements are shipped as products.

Note that the wafer obtained through the above steps may optionally be subjected to annealing or epitaxial film growth, in which case an annealed wafer, an epitaxial wafer, or a silicon on insulator (SOI) wafer can be obtained.

Thus, a silicon wafer with reduced step-forming microdefects can be produced.

EXAMPLES

Example

A silicon wafer was prepared by the disclosed method of producing a silicon wafer. First, grinding was performed on the periphery of a single crystal silicon ingot grown by the CZ process to adjust the diameter, and a notch portion indicating the <110> direction was then formed on the periphery of the ingot. Subsequently, after cutting the single crystal silicon ingot into blocks, one of the blocks provided with a notch portion was sliced to obtain a silicon wafer with a diameter of 300 mm.

Next, the periphery of the silicon wafer was subjected to a primary beveling procedure using a beveling machine. Specifically, the periphery of a silicon wafer was pressed against a coarse grit metal-bonded grindstone with the wafer being rotated, thereby performing a primary beveling procedure on a peripheral end portion of the silicon wafer.

Subsequently, the silicon wafer having been subjected to the primary beveling procedure was transferred to a lapping apparatus, and the front surface and the back surface of the silicon wafer were subjected to a primary planarization procedure.

After that, the notch portion of the silicon wafer having been subjected to the primary planarization procedure was subjected to beveling. Specifically, a metal-bonded grindstone was pressed against the notch portion while being rotated, and the grindstone was moved along the contour of the notch portion, thus the notch portion was subjected to beveling to form a beveled portion. Next, the wafer periphery other than the notch portion was subjected to a secondary beveling procedure to form a beveled portion using a grind wheel made of a resin-bonded grindstone for fine grinding, which is of finer grit than the grindstone used in the primary beveling procedure.

Subsequently, the front surface and the back surface of the silicon wafer in which the beveled portion was formed were subjected to double-side polishing. The double-side polishing was performed by while supplying an alkaline polishing slurry containing abrasive grains from the upper plate side, holding the silicon wafer loaded in a wafer retainer opening of a carrier plate between upper and lower plates to each of which a polyurethane polishing cloth is pasted, and rotating the upper plate and the lower plate in opposite directions with a predetermined pressure being applied thereto. The carrier plate was rotated in the same direction as the upper plate by a gear mechanism, and the front and back surfaces of the silicon wafer loaded in the carrier plate were polished to achieve a predetermined wafer thickness.

After that, the beveled portion of the silicon wafer having been subjected to double-side polishing was subjected to polishing using the beveled portion polishing apparatus depicted in FIGS. 2A to 2D. Specifically, first, the beveled portion of the notch portion was subjected to polishing. Prior to this polishing, the front surface of the silicon wafer was subjected to a hydrophilization process using a hydrogen peroxide solution to make the front surface of the silicon wafer to be a hydrophilic surface. After that, pure water was supplied to the hydrophilic surface at a flow rate of 1.8 L/min by spraying, thereby forming a water layer on the entire front surface. Note that alternative hydrophilizing agents include ozone and a surfactant.

After forming the water layer, a urethane buff shaped like a disk with an end having a tapered shape was pressed against the beveled portion of the notch portion while being rotated at 600 rpm. Meanwhile, an alkaline slurry containing colloidal silica was supplied as a polishing agent at a flow rate of 1.5 L/min to the beveled portion of the notch portion, and polishing was performed while inclining the wafer at an angle in a range of +55° to −55° so that the entire beveled portion would be polished. Subsequently, the silicon wafer was rotated with the back surface of the wafer being held by a suction stage, and a urethane buff was pressed against the peripheral beveled portion of the rotating wafer, thereby performing mirror-polishing on the beveled portion on the periphery of the silicon wafer other than the beveled portion of the notch portion.

Next, the silicon wafer having been subjected to polishing of the beveled portion was transferred to a single-side polishing apparatus, and the main surfaces of the silicon wafer were subjected to finish polishing. The single-side polishing was performed using a polishing cloth made of a suede material and using an alkaline slurry containing colloidal silica as a polishing agent.

After that, the silicon wafer having been subjected to finish polishing was subjected to final cleaning using a wafer cleaning apparatus. Thus, a silicon wafer was obtained.

Another silicon wafer obtained when the above block was sliced was also subjected to the same procedures described above to obtain another silicon wafer.

Conventional Example

Two silicon wafers were prepared in a similar manner to Example. Note however that the water layer was not formed on the front surface of the silicon wafer before polishing on the beveled portion of the notch portion. All the other conditions were the same as those in Example.

<Evaluation of DIC Defects>

The surface of each silicon wafer prepared according to Example and Conventional Example was measured in DIC mode (measurement mode based on DIC microscopy), using a wafer surface inspection apparatus SURFSCAN SP2 produced by KLA-Tencor Corporation). In the measurement, the threshold of the height of step-forming microdefects having a raised or recessed shape was set to 3 nm, and the number of step-forming microdefects with a height exceeding this threshold was determined. The results are given in FIG. 4.

Figure 4:
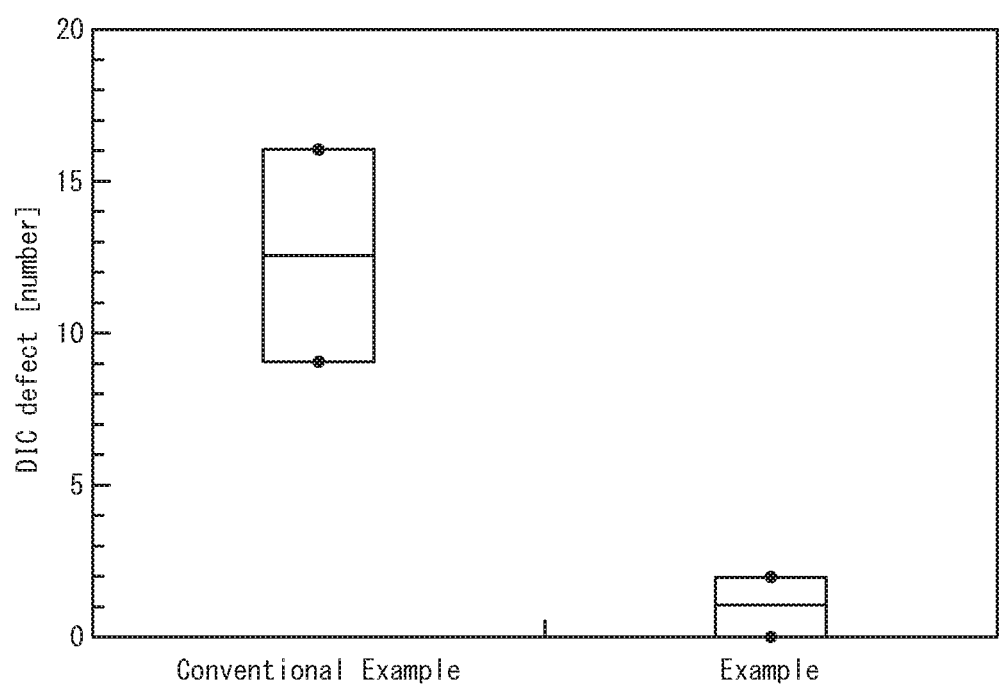
FIG. 4 is a diagram illustrating the number of step-forming microdefects in Conventional Example and Example.

As illustrated in FIG. 4, the numbers of step-forming microdefects were 9 and 16 in Conventional Example, whereas the numbers were 0 and 2 in Example. Thus, it can be seen that the formation of step-forming microdefects can be reduced by performing polishing on the beveled portion of the notch portion in a state where the front surface of the silicon wafer is wet with water.

INDUSTRIAL APPLICABILITY

According to this disclosure, polishing on a beveled portion of a notch portion of a silicon wafer is performed in a state where the front surface of the silicon wafer is wet with water, thus abrasive grains contained in splash of a slurry are prevented from adhering to the surface, and the formation of step-forming microdefects can be reduced. Hence, the disclosed methods are helpful in the semiconductor manufacturing industry.

REFERENCE SIGNS LIST 11, 23 Polishing pad
12, 22 Slurry supply means
13, 33 Water supply means
21 Table
31 Two-fluid nozzle
32 Brush
B Beam splitter
D Step-forming microdefect
F Water layer
H Splash
L Laser
M Mirror
P Photodiode
S Slurry
W Silicon wafer

The invention claimed is:

1. A method of polishing a silicon wafer, comprising:
   double-side polishing on a front surface and a back surface of a silicon wafer;
   performing polishing on a beveled portion of a notch portion of the silicon wafer while a slurry is supplied to the beveled portion of the notch portion of the silicon wafer after the double-side polishing;
   performing polishing on the beveled portion on a periphery of the silicon wafer other than the beveled portion of the notch portion after the notch portion polishing; and
   performing finish polishing on the front surface of the silicon wafer after the performing polishing on the beveled portion on a periphery of the silicon wafer,
   wherein the notch portion polishing is performed in a state where the front surface is wet with water.

2. The method of polishing a silicon wafer according to claim 1, wherein the water wet state is achieved by subjecting the front surface to a hydrophilization process to obtain a hydrophilic surface and supplying water to the hydrophilic surface after the double-side polishing.

3. The method of polishing a silicon wafer according to claim 2, wherein the hydrophilization process is chemical cleaning.

4. The method of polishing a silicon wafer according to claim 3, wherein the supply of water is performed at a flow rate of 1 L/min or more and 10 L/min or less.

5. The method of polishing a silicon wafer according to claim 4, wherein chemical cleaning is not performed between the peripheral beveled portion polishing and the finish polishing.

6. The method of polishing a silicon wafer according to claim 3, wherein chemical cleaning is not performed between the peripheral beveled portion polishing and the finish polishing.

7. A method of producing a silicon wafer, comprising the method of claim 3, wherein prior to the double-side polishing, the method of producing the silicon wafer further comprises:
   forming the notch portion on a periphery of a single crystal silicon ingot grown by the Czochralski process to obtain a notched ingot; and
   slicing the notched ingot to obtain the silicon wafer on which the double-side polishing is performed.

8. The method of polishing a silicon wafer according to claim 2, wherein the supply of water is performed at a flow rate of 1 L/min or more and 10 L/min or less.

9. The method of polishing a silicon wafer according to claim 8, wherein chemical cleaning is not performed between the peripheral beveled portion polishing and the finish polishing.

10. A method of producing a silicon wafer, comprising the method of claim 8, wherein prior to the double-side polishing, the method of producing the silicon wafer further comprises:
    forming the notch portion on a periphery of a single crystal silicon ingot grown by the Czochralski process to obtain a notched ingot; and
    slicing the notched ingot to obtain the silicon wafer on which the double-side polishing is performed.

11. The method of polishing a silicon wafer according to claim 2, wherein chemical cleaning is not performed between the peripheral beveled portion polishing and the finish polishing.

12. A method of producing a silicon wafer, comprising the method of claim 2, wherein prior to the double-side polishing, the method of producing the silicon wafer further comprises:
    forming the notch portion on a periphery of a single crystal silicon ingot grown by the Czochralski process to obtain a notched ingot; and
    slicing the notched ingot to obtain the silicon wafer on which the double-side polishing is performed.

13. The method of polishing a silicon wafer according to claim 1, wherein the water wet state is achieved by continuously supplying water to the front surface after the double-side polishing.

14. The method of polishing a silicon wafer according to claim 13, wherein chemical cleaning is not performed between the peripheral beveled portion polishing and the finish polishing.

15. A method of producing a silicon wafer, comprising the method of claim 13, wherein prior to the double-side polishing, the method of producing the silicon wafer further comprises:
- forming the notch portion on a periphery of a single crystal silicon ingot grown by the Czochralski process to obtain a notched ingot; and
- slicing the notched ingot to obtain the silicon wafer on which the double-side polishing is performed.

16. The method of polishing a silicon wafer according to claim 1, wherein chemical cleaning is not performed between the peripheral beveled portion polishing and the finish polishing.

17. A method of producing a silicon wafer, comprising the method of claim 16, wherein prior to the double-side polishing, the method of producing the silicon wafer further comprises:
- forming the notch portion on a periphery of a single crystal silicon ingot grown by the Czochralski process to obtain a notched ingot; and
- slicing the notched ingot to obtain the silicon wafer on which the double-side polishing is performed.

18. A method of producing a silicon wafer, comprising the method of claim 1, wherein prior to the double-side polishing, the method of producing the silicon wafer further comprises:
- forming the notch portion on a periphery of a single crystal silicon ingot grown by the Czochralski process to obtain a notched ingot; and
- slicing the notched ingot to obtain the silicon wafer on which the double-side polishing is performed.

* * * * *